US010163783B1

(12) United States Patent
Chang et al.

(10) Patent No.: US 10,163,783 B1
(45) Date of Patent: Dec. 25, 2018

(54) REDUCED AREA EFUSE CELL STRUCTURE

(71) Applicant: Taiwan Semiconductor Manufacturing Co., Ltd., Hsin-Chu (TW)

(72) Inventors: Meng-Sheng Chang, Chu Bei (TW); Shao-Tung Peng, Hsinchu County (TW); Shao-Yu Chou, Chu Pei (TW); Liang Chuan Chang, Hsinchu (TW); Yao-Jen Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/922,439

(22) Filed: Mar. 15, 2018

(51) Int. Cl.
*G11C 17/18* (2006.01)
*H01L 23/525* (2006.01)
*G11C 17/16* (2006.01)
*H01H 85/046* (2006.01)
*H01H 85/05* (2006.01)
*H01L 23/50* (2006.01)

(52) U.S. Cl.
CPC .......... *H01L 23/5256* (2013.01); *G11C 17/16* (2013.01); *G11C 17/18* (2013.01); *H01H 85/046* (2013.01); *H01H 85/05* (2013.01); *H01L 23/50* (2013.01)

(58) Field of Classification Search
CPC ... H01L 23/5256; H01L 23/50; H01H 85/046; H01H 85/05; G11C 17/16; G11C 17/18
See application file for complete search history.

(56) References Cited

U.S. PATENT DOCUMENTS

| | | | | |
|---|---|---|---|---|
| 8,564,023 B2 * | 10/2013 | Im | ............ | G11C 17/16 257/209 |
| 8,760,955 B2 * | 6/2014 | Liao | ............ | G11C 17/18 365/148 |
| 2009/0141578 A1 * | 6/2009 | Bang | ............ | G11C 17/143 365/225.7 |
| 2010/0230780 A1 * | 9/2010 | Obayashi | ............ | G11C 17/18 257/529 |
| 2011/0116299 A1 * | 5/2011 | Obayashi | ............ | G11C 17/16 365/96 |
| 2013/0039117 A1 | 2/2013 | Lin et al. | | |
| 2017/0005036 A1 * | 1/2017 | Kodama | ............ | H01L 21/82 |

* cited by examiner

*Primary Examiner* — Toan K Le
(74) *Attorney, Agent, or Firm* — Duane Morris LLP

(57) ABSTRACT

An integrated circuit structure includes a first fuse line formed in a first metal layer; a second fuse line formed in the first metal layer; a first pair of fuse wings formed in the first metal layer on opposite sides of a first end of the first fuse line; a second pair of fuse wings formed in the first metal layer on opposites sides of a first end of the second fuse line; a third pair of fuse wings formed in the first metal layer on opposite sides of a second end of the first fuse line; and a fourth pair of fuse wings formed in the first metal layer on opposites sides of a second end of the second fuse line. The first and second pairs of fuse wings share a first common fuse wing and the third and fourth pairs of wings share a second common fuse wing.

20 Claims, 10 Drawing Sheets

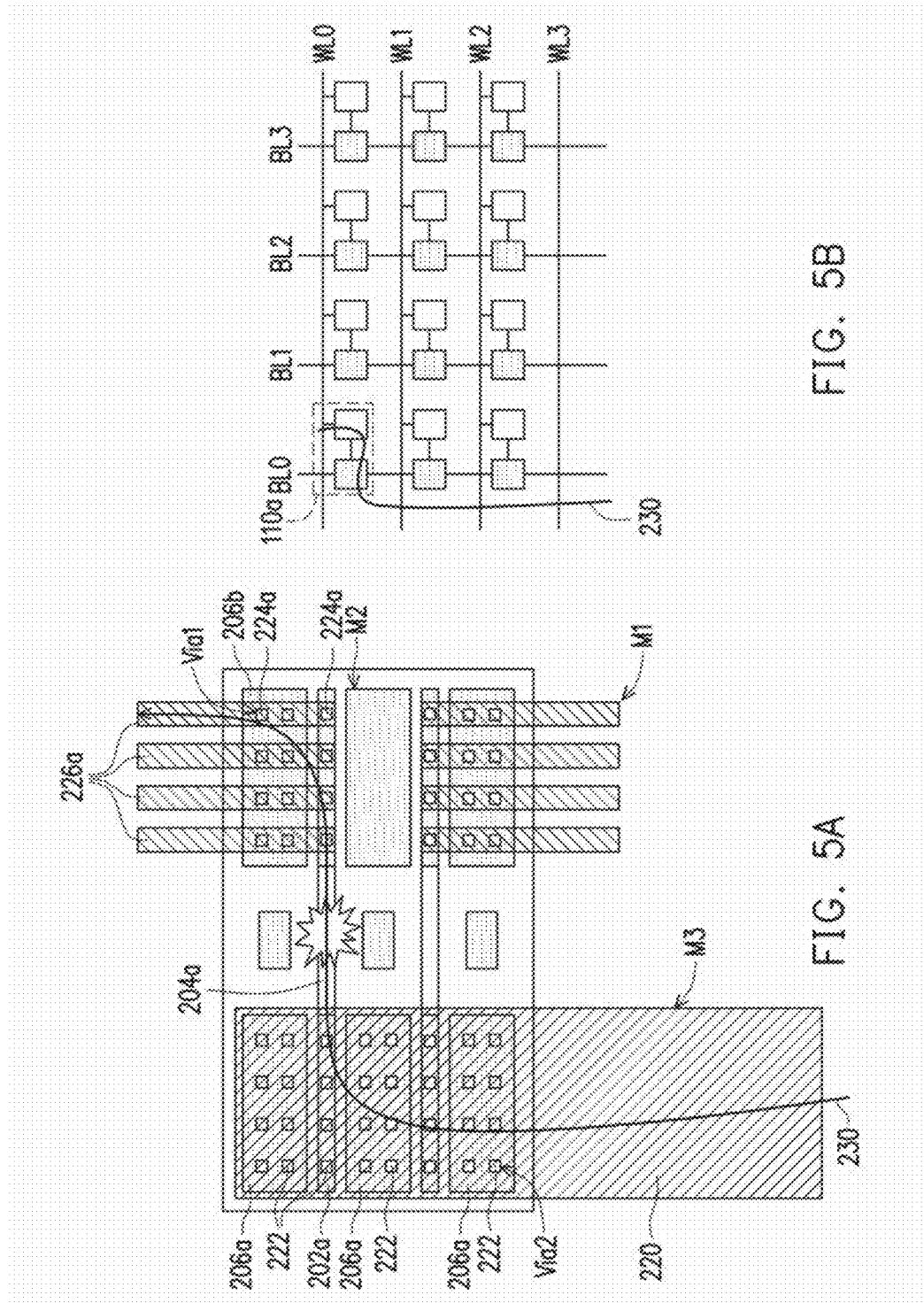

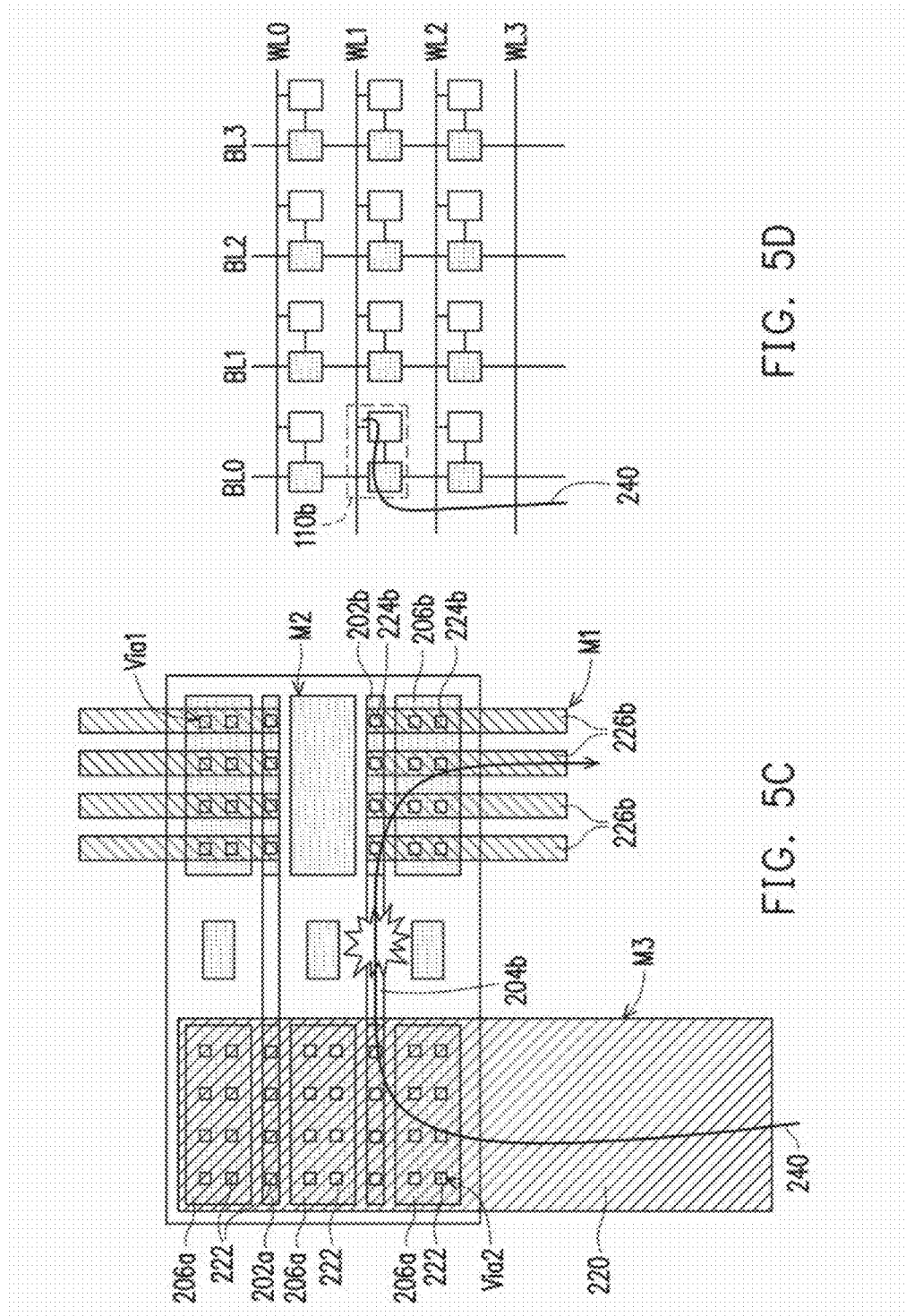

REDUCED AREA EFUSE CELL STRUCTURE

BACKGROUND

Electrical fuses (eFuses) are used to reprogram integrated circuit chips, such computer chips. For example, eFuses can be used to provide in-chip performance tuning. If a subsystem fails, for example, an eFuse can be blown to change behavior or to switch in a back-up system. A chip may be provided with an array of eFuse cells. An approach known to the applicant is the 1T1R eFuse architecture where each eFuse cell includes an NMOS program transistor (1T) and a fuse element (1R). The layout of the 1T1R eFuse cell structure makes it very difficult to reduce the overall area of the eFuse array. For example, the fuse elements of this architecture are located in the metal 2 (M2) layer of the integrated circuit, which is subject to strict design rule check (DRC) constraints that define, for example, all metal line minimum and maximum widths and metal line spacing, amongst other rules. These constraints mean that the eFuse area can't simply be reduced by reducing the fuse size (i.e., metal line width) or spacing (i.e., between fuse lines). Further, within an array of eFuses, all eFuses in the same column of fuse cells are connected to and share the same bit line through which the programming current is provided. This arrangement leads to a larger resistance in the program path, which reduces the programming current.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIGS. 5A and 5B illustrate the program path when a first eFuse cell is selected, in accordance with some embodiments.

FIGS. 5C and 5D illustrate the program path when a second eFuse cell is selected, in accordance with some embodiments.

DETAILED DESCRIPTION OF EXEMPLARY EMBODIMENTS

Figure 1:
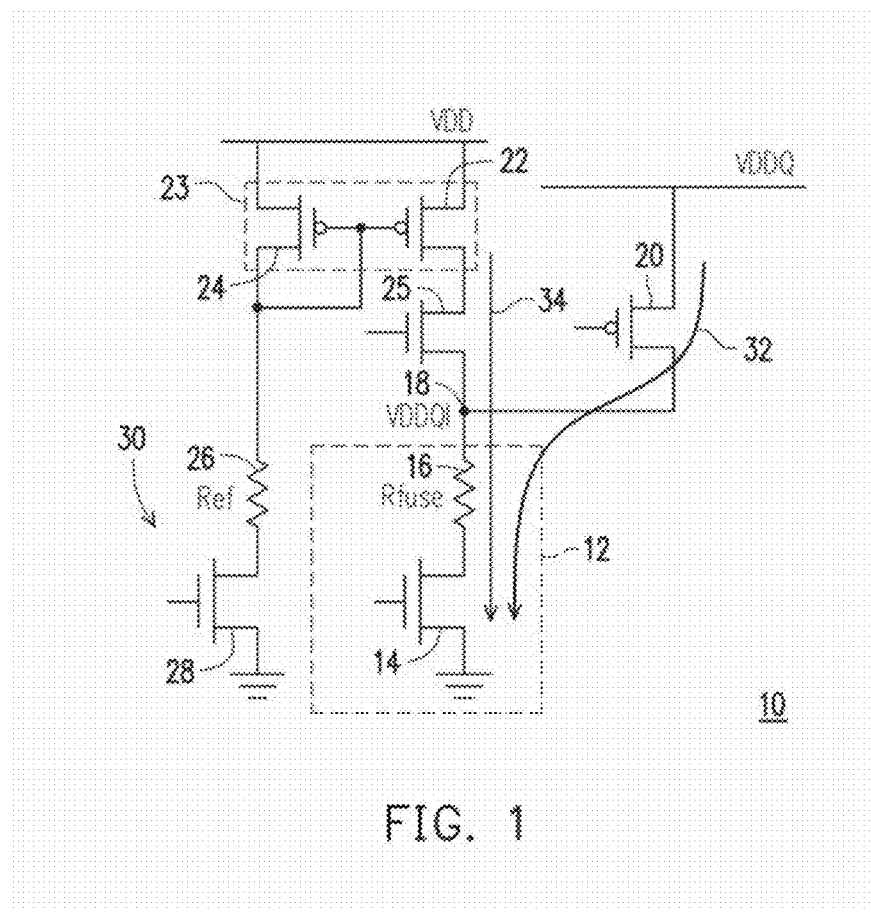
FIG. 1 illustrates the read path and program path of an eFuse cell from an eFuse cell array formed in an integrated circuit structure, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 (FIG. 1) illustrates part of an integrated circuit structure, specifically an integrated circuit structure having an eFuse array. More specifically, FIG. 1 illustrates the read path 34 and program path 32 for an eFuse cell 12. The eFuse cell includes a fuse element 16, labeled Rfuse, which can be considered a resistance in line with a selection transistor 14, which in embodiments is a word line selection transistor. The fuse element 16 is connected to a node 18 where the read and program voltages VDDQI are provided. The program path includes a selection transistor 20, which in embodiments is a bit line selection transistor, that couples the VDDQI node 18 to the program voltage VDDQ rail in the program path 32. The read path 34 includes a bit line selection transistor 25 for coupling the VDDQI node 18 to VDD supply rail. A sense amplifier 23, including PMOS transistor 22 in the read path 34 and PMOS transistor 24, which forms a current mirror with PMOS transistor 22, couples the read path 34 to a reference circuit 30 that includes a reference resistor Ref and a selection transistor 28.

Figure 2A:
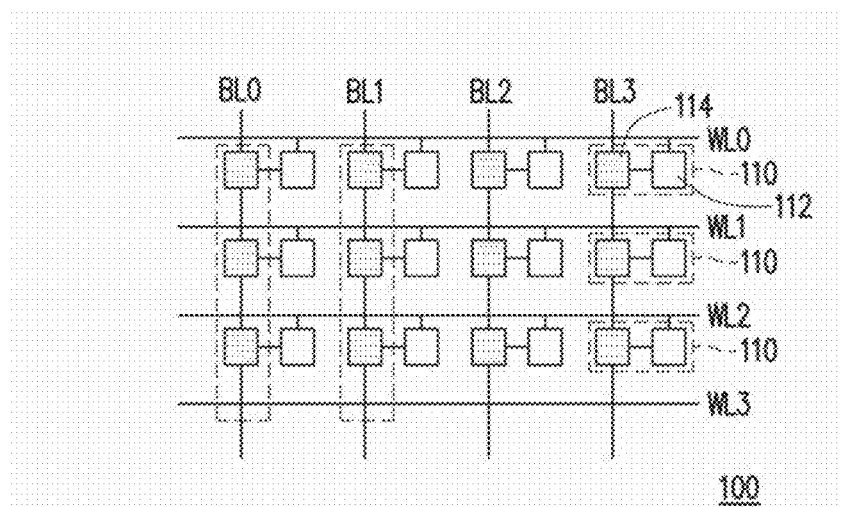
FIG. 2A illustrates an array of eFuse cells, in accordance with some embodiments.
Figure 2B:
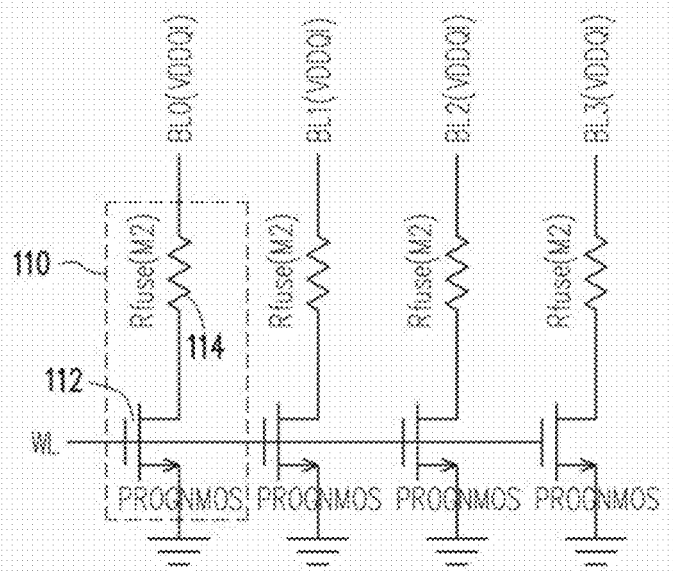
FIG. 2B illustrates in more detail the connection of each eFuse cell in a row of eFuse cells from an array of eFuse cells to a common word line and respective bit line, in accordance with some embodiments.

FIG. 2A (FIG. 2A) illustrates an array 100 of eFuse cells 110 arranged in a plurality of rows and columns. The array 100 is illustrated as having four columns of eFuse cells 110 connected to four different bit lines BL0, BL1, BL2 and BL3, respectively. Each row of eFuse cells 110 is also coupled to a respective word line, e.g., WL0, WL1, WL2, WL3. Each eFuse cell 110 is individually accessible via a word line (WL) and bit line (BL) combination. Each eFuse cell includes a fuse element 114 and a program transistor 112. FIG. 2B shows in more detail the connection of each eFuse cell 110 in a row of eFuse cells 110 to a common word line (WL) and respective bit line (BL0, BL1, BL2, or BL3).

Each cell 110 includes an NMOS program transistor 112 and a fuse element 114 formed in the M2 layer, in accordance with certain embodiments. It should be understood, that program transistor may also be a PMOS transistor.

Figure 3:
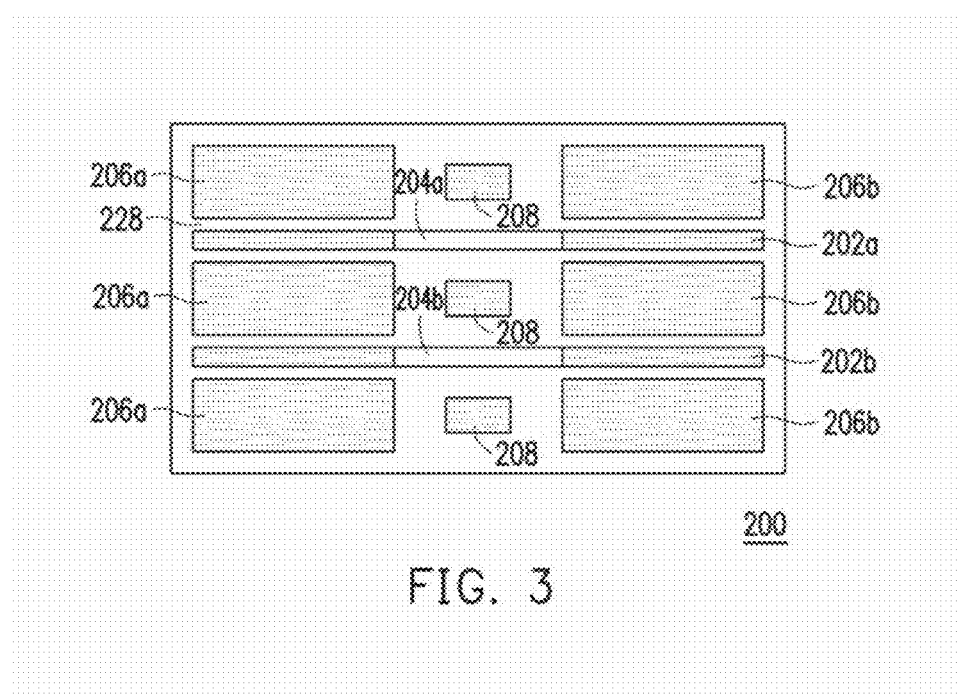
FIG. 3 illustrates a layout for adjacent eFuses connected to a common bit line, in accordance with some embodiments.

FIG. 3 (FIG. 3) illustrates an improved layout for adjacent eFuses connected to a common bit line, i.e., in the same column of an array 100 of eFuse cells 110, in accordance with certain embodiments. This layout is sometimes referred to in this disclosure as a 1T2R1T layout, as components of the two eFuses (2R) are shared between two adjacent eFuses. Specifically, FIG. 3 shows the structure of the metal 2 (M2) layer 200 in an integrated circuit. The structure includes a first fuse line 202a with a first main fuse link 204a and a second fuse line 202b with a second main fuse link 204b. The adjacent fuse lines 202a, 202b are spaced from one another by first and second fuse wings 206a and 206b. Altogether, the structure includes six fuse wings 206 per two fuse lines 202. That is, the first fuse line 202a is associated with a first pair of fuse wings at its first end (i.e., the topmost fuse wing 206a and the middle fuse wing 206a disposed between the fuse lines 202a and 202b) and a second pair of fuse wings at its second end (i.e., the topmost fuse wing 206b and the middle fuse wing 206b disposed between the fuse lines 202a and 202b). And the second fuse line 202b is associated with a first pair of fuse wings at its first end (i.e., the bottommost fuse wing 206a and the middle fuse wing 206a disposed between the fuse lines 202a and 202b) and a second pair of fuse wings at its second end (i.e., the bottommost fuse wing 206b and the middle fuse wing 206b disposed between the fuse lines 202a and 202b). As such, the middle fuse wing 206a disposed between the first and second fuse lines 202a and 202b is a first common fuse wing amongst the first pairs of fuse wings, and the middle fuse wing 206b is a second common fuse wing amongst the second pairs of fuse wings. It should be understood that the fuse wings 206a, 206b and the fused lines 202a, 202b are spaced from one another in the M2 layer by an insulator 228. In embodiments, the insulator is an extreme low-k dielectric material.

The structure also includes a fuse wall 208 disposed between adjacent main fuse links 204. During programming, a main fuse link 204 is blown, and the fuse wall 208 blocks metal and oxide residue from the blown fuse link from leaving the area and interfering with other portions of the integrated circuit.

Figure 4:
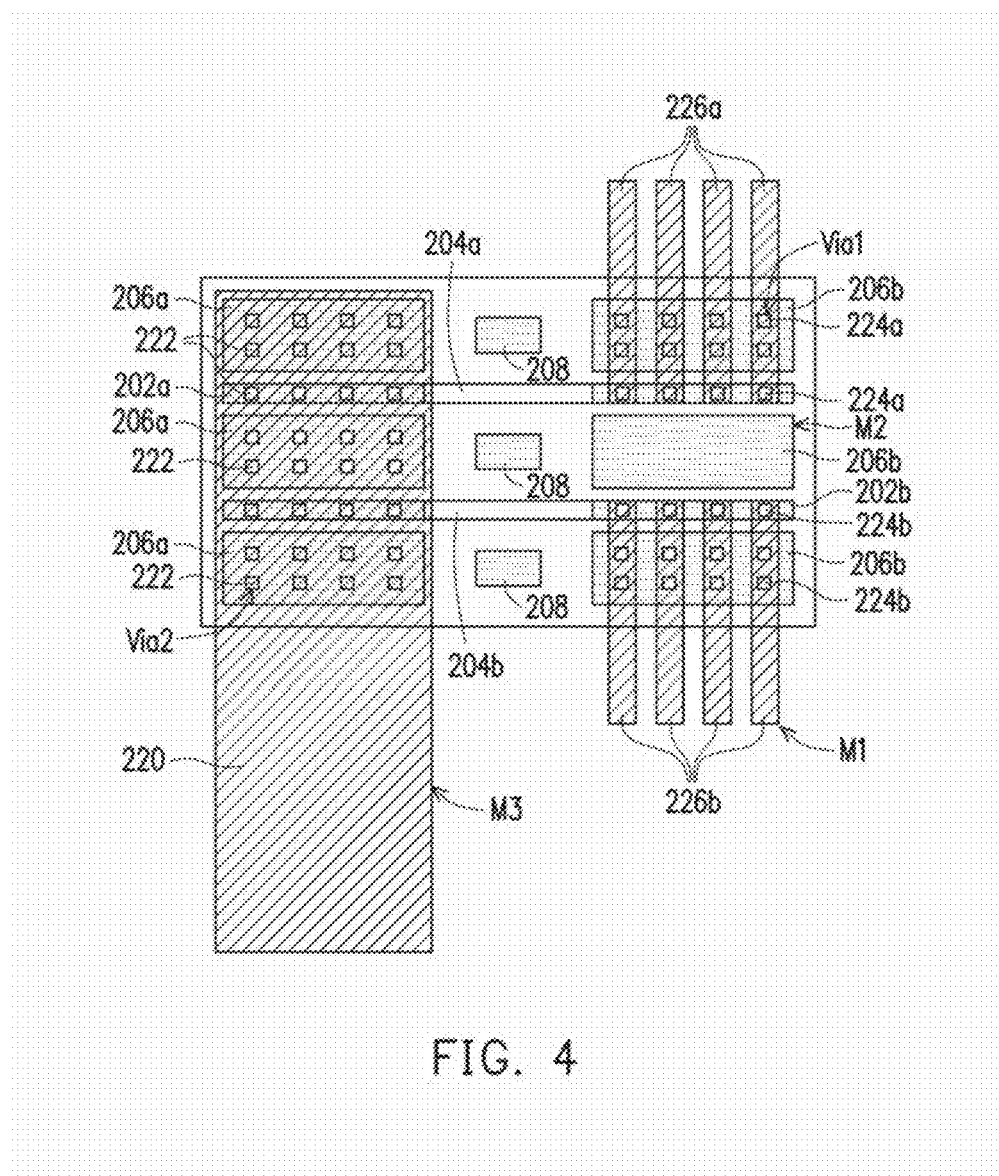
FIG. 4 illustrates the connections to the fuse elements that reside in the M2 layer, in accordance with some embodiments.

FIG. 4 (FIG. 4) illustrates the connections to the fuse elements that reside in the M2 layer. As shown in FIG. 4, a bit line 220 is formed in the metal three (M3) layer above the M2 layer. The bit line 220 overlies the first set of fuse wings 206a and a first end of each of the first and second fuse lines 202a and 202b. The bit line 220 is electrically coupled to the second metal layer (M2), specifically to the first fuse wings 206a and the first end of the first and second fuse lines 202a and 202b through vias 222 connecting the M2 and M3 layers, i.e., Via2 connections. The fuse walls 208 are allowed to float, as is the central one of the second fuse wings 206b. The second end of the first fuse line 202a and the adjacent (topmost one) of the fuse wings 206b are electrically coupled to a first set of one or more metal lines 226a in the first metal interconnection layer (M1), which underlies the M2 layer, by a first set of vias 224a. It should appreciate that the M1 lines 226a and vias 224a are underneath the M2 layer and the view illustrated in FIG. 4 is for ease of illustration only. Though not shown in FIG. 4, but shown in the cross-sectional view of FIG. 7, the metal lines 226a are coupled to an NMOS program transistor (through the Via0 and M0 layers) for programming the first main fuse link 204a of the first fuse line 202a.

The second end of the second fuse line 202b and the adjacent (bottommost one) of the fuse wings 206b are electrically coupled to a second set of one or more metal lines 226b in the first metal interconnection layer (M1), which underlies the M2 layer, by a second set of vias 224b. As noted above, it should be appreciated that the M1 lines 226b and vias 224b are underneath the M2 layer and the view illustrated in FIG. 4 is for ease of illustration only. Though not shown in FIG. 4, but shown in the cross-sectional view of FIG. 7, the metal lines 226b are coupled to an NMOS program transistor (through the Via1 and M0 layers) for programming the second main fuse link 204b of the second fuse line 202b.

FIG. 5A (FIG. 5A) and FIG. 5B (FIG. 5B) juxtapose the illustrations of FIGS. 2 and 4, respectively, so as to illustrate the program path 230 when eFuse cell 110a is selected. Specifically, eFuse cell 110a is selected when word line WL0 is selected and bit line BL0 (shown as M3 line 220 in FIGS. 4 and 5A) is selected. As can be seen in the figures, the program current flows (i) through M3 line 220, which corresponds to BL0, (ii) through the Via2 connections 222 to first fuse line 202a, and (iii) through the first fuse line 202a, including first main fuse link 204a, to the first set of M1 metal lines 226a through the Via1 connections 224a. As explained above, the first set of M1 metal lines 226a are connected to the NMOS program transistor of the eFuse cell 110a, which is selected by word line WL0. The flow of programming current through this program path 230 causes the first main fuse link 204a to blow, which is illustrated in FIG. 5A.

As shown in FIG. 5A, the wings 206a on either side of the first fuse line 202a, and the wings 206b on either side of the first fuse line 202a, are spaced from the first fuse line 202a and thus are not directly coupled within the M2 layer to the first main fuse link 204a. However, the presence of the wings 206a and 206b has a positive effect on the blow yield. The wings 206a and wings 206b reduce the region mesh resistance, i.e., the region's parasitic resistance. Reducing the parasitic resistance of the region at both sides of the first fuse line 202a increases the programming current through the first fuse line 202a and improves programming (blow) yield for main fuse link 204a.

FIG. 5C (FIG. 5C) and FIG. 5D (FIG. 5D) juxtaposes the illustrations of FIGS. 2 and 4, respectively, so as to illustrate the program path 240 when eFuse cell 110b is selected. Specifically, eFuse cell 110b is selected when word line WL1 is selected and bit line BL0 (shown as M3 line 220 in FIGS. 4 and 5B) is selected. As can be seen in the figure, the program current flows (i) through M3 line 220, which corresponds to BL0, (ii) through the Via2 connections 222 to second fuse line 202b, and (iii) through the second fuse line 202b, including first main fuse link 204b, to the second set of M1 metal lines 226b through the Via1 connections 224b. As explained above, the second set of M1 metal lines 226b are connected to the NMOS program transistor of the eFuse cell 110b, which is selected by word line WL1. The flow of programming current through this program path 240 causes the second main fuse link to blow, which is illustrated in FIG. 5B.

As illustrated above, the bit line side of each eFuse uses the M3-Via2-M2 connection, and the NMOS transistor side of each eFuse uses the M2-Via1-M1 connection. The metal 2 (M2) layout for the fuse structure allows two adjacent eFuse elements that share a common bit line and that are triggered by adjacent word lines to share fuse wings, specifically the fuse wing 206a and fuse wing 206b disposed between first and second fuse lines 202a, 202b. Allowing two independently selectable fuses to share common structure in the M2 layer, essentially creating a repeatable 1T2R1T fuse structure, allows for significant reductions in cell area, for example a 15-20% reduction in the area consumed by the 1T2R1T layout when compared to two 1T1R structures. This space savings along the program path, as will be described in more detail in connection with FIG. 8, reduces the resistance of the program path, which increases the program current available for blowing selected fuses and, therefore, improves device performance.

Figure 6:
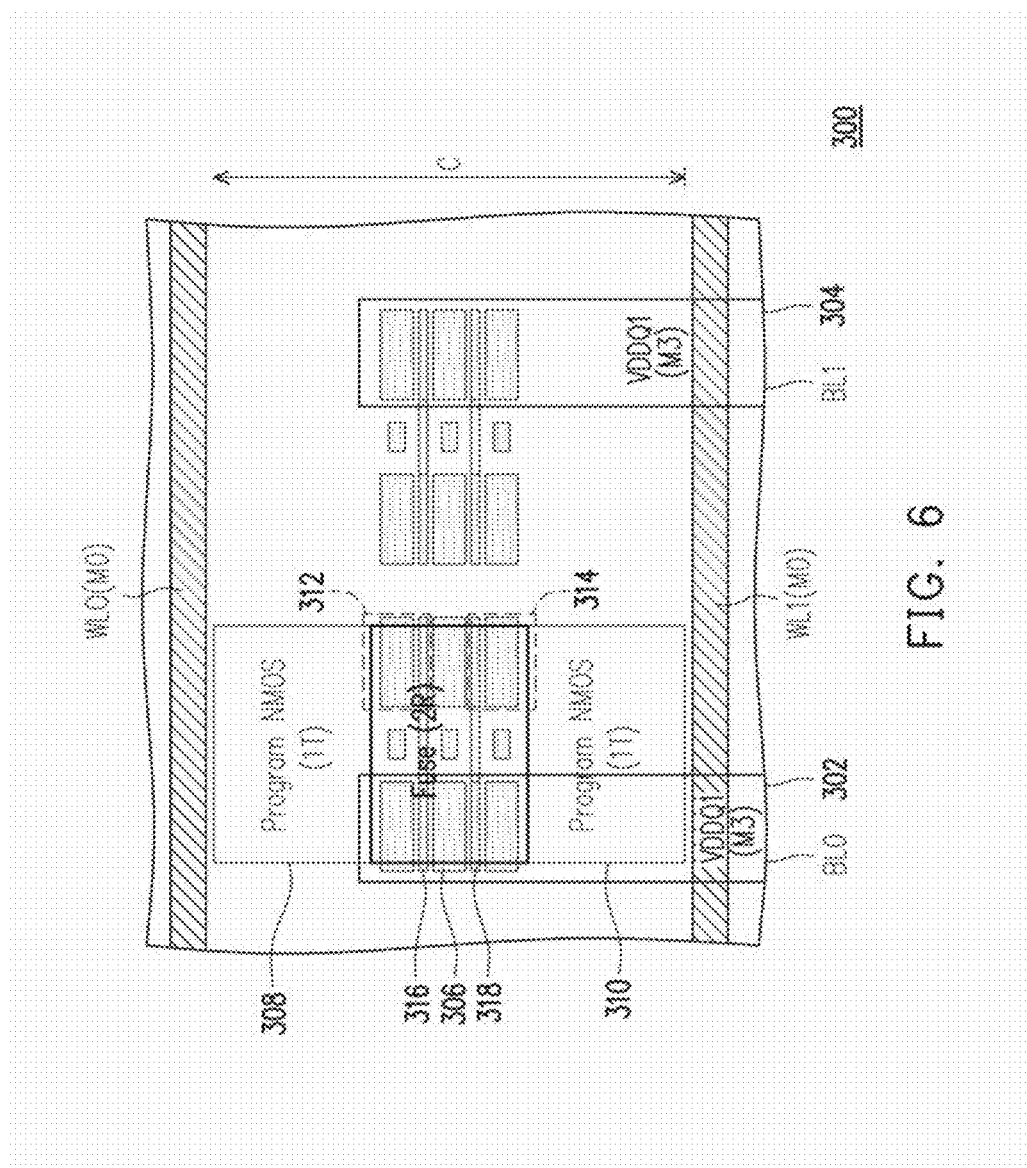
FIG. 6 shows a layout of the device layers for a 1T2R1T eFuse architecture, in accordance with some embodiments.

FIG. 6 (FIG. 6) shows a layout of the device layers with the following area illustrated: an area 302 in the M3 layer corresponding to a bit line (e.g., BL0); an area 304 in the M3 layer corresponding to an adjacent bit line (e.g., BL1); an area 306 in the M2 layers shared by the fuse structure of two eFuse cells; an area 308 for the NMOS program transistor of a first eFuse cell connected to word line WL0 in the M0 layer; an area 310 for the NMOS program transistor of a second eFuse cell connected to word line WL1 in the M0 layer; an area 312 in the M1 layer for the metal line(s) connections between a first fuse line 316 in the M2 fuse area 306 and the NMOS program transistor in area 308; and an area 314 in the M1 layer for the metal line(s) connections between a second fuse line 318 in the M2 fuse area 306 and the NMOS program transistor in area 310.

Figure 7:
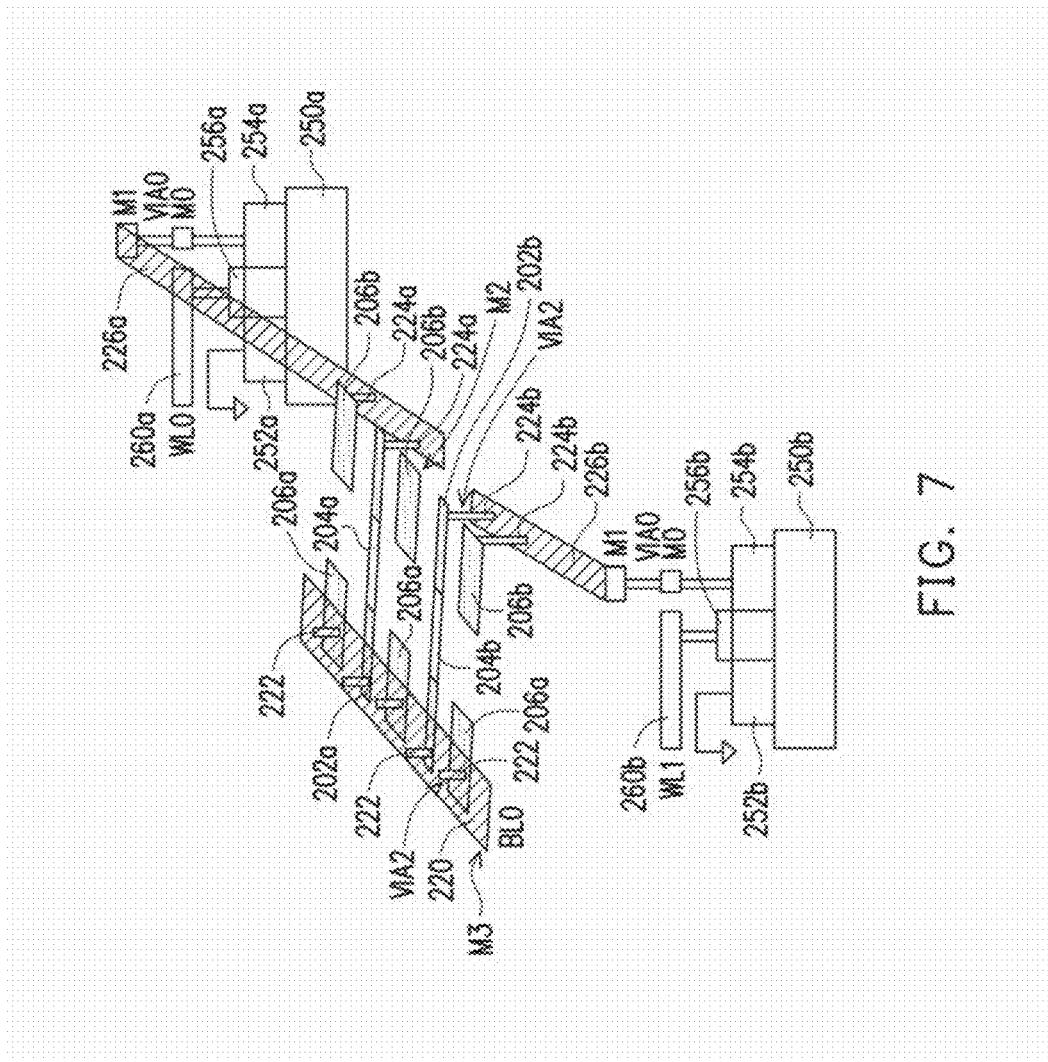
FIG. 7 illustrates as a cross-sectional perspective view the 1T2R1T architecture of FIG. 4 to FIG. 6, in accordance with some embodiments.

FIG. 7 (FIG. 7) shows a cross-sectional perspective view of the 1T2R1T architecture illustrated in FIGS. 4-6, specifically the connection of the bit line (BL0) 220 through the fuse structure down to the selection transistors 250a, 250b of the two eFuse cells. As illustrated, the bit line 220 is formed in the M3 layer and connected by vias 222 (not all of which are shown for ease of illustration) in the VIA2 layer to the first end of the first and second fuse lines 202a, 202b and to the adjacent fuse wings 206a. The NMOS selection transistor 250a of a first eFuse cell, which is addressable by the BL0/WL0 combination, has its source 252a connected to ground, its gate 256a coupled to the word line (WL0) 260a that is formed in the M0 layer, and its drain 254a coupled to the M1 metal line 226a through a VIA0 and M0 connection. The second NMOS selection transistor 250b, which is addressable by the BL0/WL1 combination, has its source 252b connected to ground, its gate 256b coupled to the word line (WL1) 260b that is formed in the M0 layer, and its drain 254b coupled to the M1 metal line 226b through a VIA0 and M0 connection. FIG. 7 does not illustrate the optional fuse walls 208.

Figure 8:
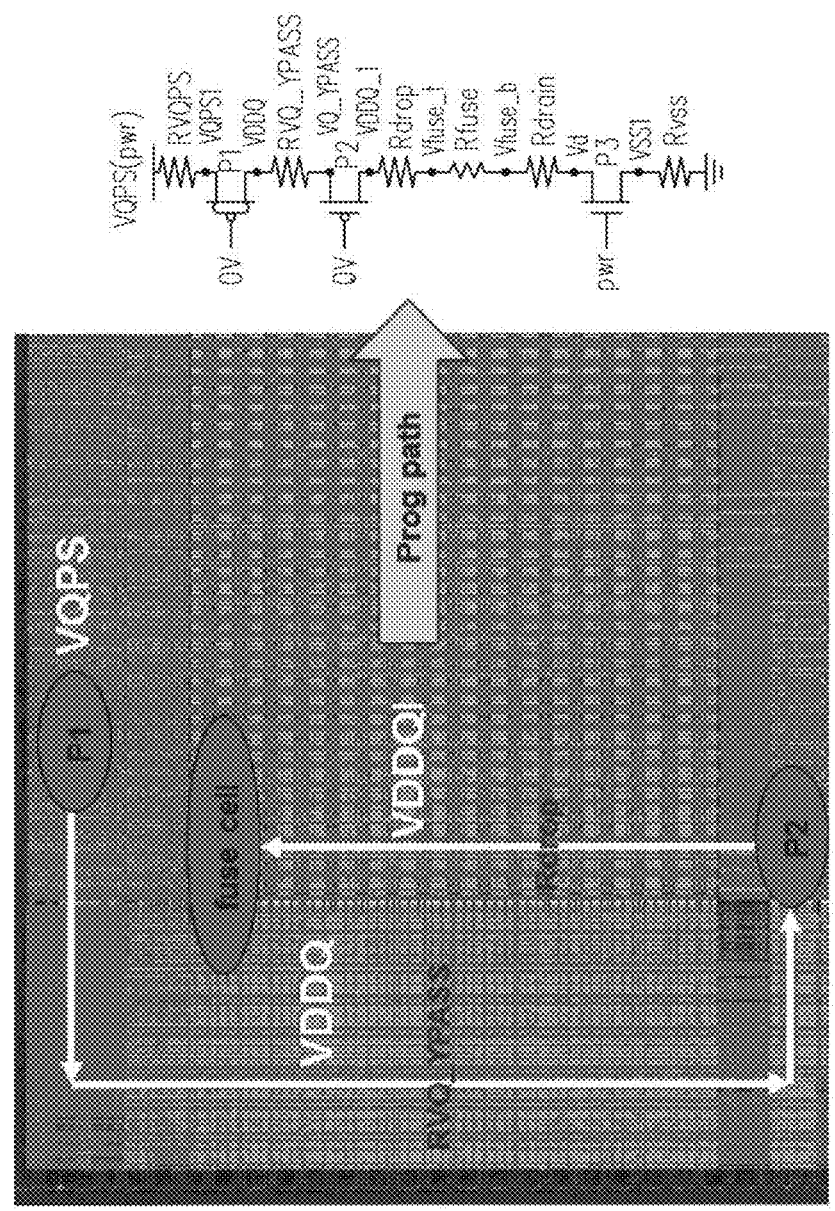
FIG. 8 illustrates the program path for a fuse cell, both physically and as represented by a circuit path, in accordance with some embodiments.

FIG. 8 (FIG. 8) illustrates the program path for a fuse cell, both as a physical layout and as represented by a circuit path. The path extends between power supply VQPS to ground. There is a resistance RVQPS associated with the connection of the power supply VQPS to the PMOS power switch transistor P1. Voltage VDDQ (shown in FIG. 1) is provided at the drain of the PMOS power switch transistor P1. The path extends in the Y-direction to a PMOS program selection transistor P2, which corresponds to transistor 32 in FIG. 1. The resistance of the path between PMOS program selection transistor P2 and PMOS power switch transistor P1 is identified as RVQ_YPASS. Again, in the Y-direction, a path exists from the PMOS program selection transistor P2 to the fuse cell and has a resistance identified as Rdrop. The fuse cell resistance includes the resistance of the fuse element (fuse 16 in FIG. 1), which is identified as Rfuse in FIG. 8, and the resistance of the connection between the fuse to the program transistor (transistor 14 in FIG. 1), which is identified as Rdrain in FIG. 8. The program path extends through the NMOS selection transistor P3 in the circuit diagram of FIG. 8 to ground. This connection is identified as having resistance Rvss. The table below (Table 1) compares parameters for a 7 nm generation when using a 1T1R layout for each of two eFuse cells and when using the improved 1T2R1T layout described above in connection with FIG. 4 to FIG. 7:

TABLE 1

| Parameter (ohms) | 1T1R | 1T2R1T |
|---|---|---|
| RVQPS | 2.16 | 2.16 |
| RVQ_YPASS | 17.48 | 13.27 |
| Rdrop | 25.86 | 18.49 |
| Rdrain | 5.1 | 5.1 |
| RVSS | 4 | 4 |
| Total | 54.6 | 43.02 |

As can be seen from the table above, the 1T2R1T layout results in a reduction in resistance in RVQ_YPASS from 17.48 to 13.27, which is a reduction of about 24%. The layout also results in a reduction in resistance of Rdrop from 25.86 to 18.49, which is a reduction of about 28.5%. The overall resistance of the components from the program path listed in Table 1 dropped from 54.6 to 43.02, which is a reduction of 21.2%.

Similar benefits can be achieved in other technology generations, such as the 5 nm generation. In the 5 nm generation, it was observed that the Y-direction length (measurement C in FIG. 6) of the 1T2R1T structure was 1.798 µm whereas having two 1T2R cell layouts would occupy 2.164 µm. This amounts to a 0.366 µm savings in the Y-direction attributable to two adjacent fuses, which results in about a 16.9% savings in cell area. In embodiments, 64 or 128 fuses may be included in the Y-direction, which results in significant space savings (i.e. 32×0.366 µm or 64×0.366 µm savings in the Y-direction. For example, the table below (Table 2) compares parameters for a 5 nm generation when using a 1T1R layout for each eFuse cell and when using the improved 1T2R1T layout:

TABLE 2

| Parameter (ohms) | 1T1R | 1T2R1T |
|---|---|---|
| RVQPS | 5.18 | 5.18 |
| RVQ_YPASS | 41.95 | 37.60 |
| Rdrop | 62.06 | 54.34 |
| Rdrain | 6 | 6 |
| RVSS | 4.8 | 4.8 |
| Total | 119.99 | 107.92 |

Similar to the 7 nm generation, the 1T2R1T layout results in a reduction in resistance in RVQ_YPASS, specifically from 41.95 to 37.6, which is a reduction of about 10.4%. The layout also results in a reduction in resistance of Rdrop from 62.06 to 54.34, which is a reduction of about 12.4%. The overall resistance of the program path dropped from 119.99 to 107.92, which is a reduction of about 10.1%. The programming current available for programming the fuse element increases with the lower resistance of the path, which results in improved program performance.

Figure 9:
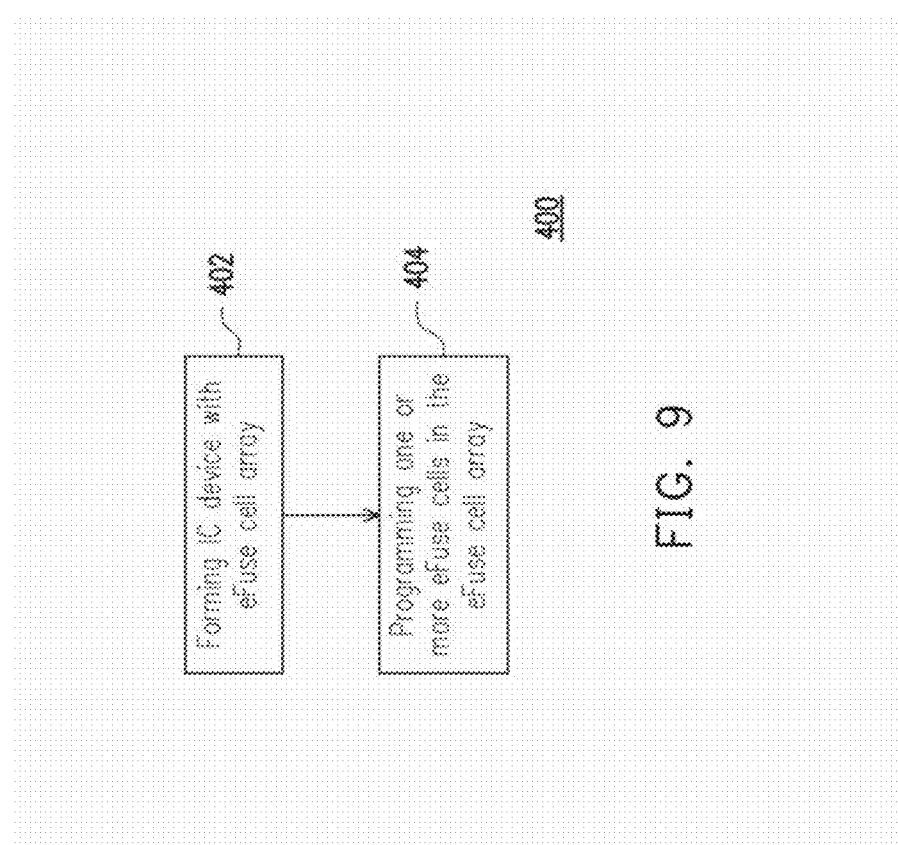
FIG. 9 illustrates a method 400 of forming a programmed integrated circuit device, in accordance with some embodiments.

FIG. 9 (FIG. 9) illustrates a method 400 of forming a programmed integrated circuit device. At step 402, an integrated circuit device is formed having a eFuse cell array in accordance with embodiments described herein. For example, in certain embodiments, the eFuse cell array, and cell structure, can be formed as illustrated in FIGS. 2A to 8 described above. At step 404, one or more cells of the eFuse cell array of the integrated circuit device are programmed, thereby forming a programmed device. In embodiments, this programming step involves providing a programming current that is sufficient to damage a main fuse link 204 of a cell or cells in the eFuse cell array.

The present disclosure provides various embodiments of an integrated circuit structure having an improved layout for the fuse elements of an array of eFuse cells. The improved layout, which in embodiments is in the M2 interconnection layer in which the fuse elements are formed and which conforms to DRC checks applicable to that layer, reduces eFuse cell area, as compared to a 1T1R layout. The reduced cell area results in reduced program path resistance, which increases the program current and improves program performance.

In an embodiment of an integrated circuit structure, the integrated circuit structure includes a first fuse line formed in a first metal layer; a second fuse line formed in the first metal layer; a first pair of fuse wings formed in the first metal layer on opposite sides of a first end of the first fuse line; a second pair of fuse wings formed in the first metal layer on opposites sides of a first end of the second fuse line; a third pair of fuse wings formed in the first metal layer on opposite sides of a second end of the first fuse line; and a fourth pair of fuse wings formed in the first metal layer on opposites sides of a second end of the second fuse line, wherein the first and second pairs of fuse wings share a first common fuse wing and the third and fourth pairs of fuse wings share a second common fuse wing. In an embodiment, the integrated circuit structure further includes a first selection transistor coupled to the second end of the first fuse line and to a first word line; a second selection transistor coupled to the second end of the second fuse line and to a second word line; and a bit line coupled to the first ends of the first and second fuse lines. In an embodiment of the integrated circuit structure, the bit line is coupled to the first and second pairs of fuse wings. In an embodiment of the integrated circuit structure, the bit line is formed in a second metal layer above the first metal layer. In an embodiment of the integrated circuit structure, the first metal layer is a M2 metal interconnection layer of the integrated circuit structure and the second metal layer is a M3 metal interconnection layer of the integrated circuit structure. In an embodiment, the first selection transistor is coupled to the second end of the first fuse line through a first metal line formed in a second metal layer formed below the first metal layer and the second selection transistor is coupled to the second end of the first fuse line through a second metal line formed in the second metal layer. In an embodiment, the first and second word lines are formed in a third metal layer below the second metal layer. In an embodiment, the first metal line is coupled to a first one of the fuse wings in the third pair of fuse wings and the second metal line is coupled to a first one of the fuse wings in the fourth pair of fuse wings. In an embodiment, the second common fuse wing of the third and fourth pairs of fuse wings is floating. In an embodiment, the integrated circuit structure includes a fuse wall formed in the first metal layer, the fuse wall being disposed between a central portion of the first fuse line and a central portion of the second fuse line. In an embodiment, the integrated circuit structure further includes a second fuse wall formed in the first metal layer and disposed adjacent to the central portion of the first fuse line and a third fuse wall formed in the first metal layer and disposed adjacent to the central portion of the second fuse line. In an embodiment, the fuse wings of the first, second, third and fourth pairs of fuse wings are spaced from the first and second fuse lines within the first metal layer by an insulator.

In another embodiment of an integrated circuit structure, the integrated circuit structure includes an array of eFuse cells arranged in a plurality of rows and columns of eFuse cells, each eFuse cell including a respective selection transistor coupled to a respective word line and a respective fuse element formed in a metal layer, the fuse element being coupled to a respective bit line at a first end of the fuse element and to the selection transistor at a second end of the fuse element; the fuse element including a fuse line, a first pair of fuse wings formed on opposite sides of the first end of fuse line and a second pair of fuse wings formed on opposite sides of the second end of the fuse line; and wherein each fuse element shares a fuse wing from the first pair of fuse wings and a fuse wing from the second pair of fuse wings with the fuse element of one adjacent eFuse cell in the column of eFuse cells in which it is located. In an embodiment, the fuse wings of the first pair of fuse wings of each fuse element are coupled to the respective bit line to which the first end of the fuse element is coupled. In an embodiment, one of the fuse wings of the second pair of fuse wings of each fuse element is coupled to the selection transistor and the other one of the fused wings of the second pair of fuse wings is floating. In an embodiment, the floating fuse wing is the fuse wing shared with the fuse element of the one adjacent eFuse cell. In an embodiment, the integrated circuit structure further includes a pair of fuse walls formed on opposite sides of a central portion of the fuse line of each fuse element. In an embodiment, the fuse wings of each fuse element are spaced from the fuse line within the metal layer by an insulator.

Yet in another embodiment, an integrated circuit structure includes a first selection transistor of a first eFuse cell; a second selection transistor of a second eFuse cell; a first interconnection layer formed over the first and second selection transistors; a second interconnection layer formed over the first interconnection layer; a third interconnection layer formed over the second interconnection layer; a fourth interconnection layer formed over the third interconnection layer; a first word line formed in the first interconnection layer and coupled to a gate of the first selection transistor; a second word line formed in the first interconnection layer and coupled to a gate of the second selection transistor; first and second fuse elements formed in the second interconnection layer, each fuse element including a fuse line having a first pair of fuse wings disposed on opposite sides of a first end of the fuse line and a second pair of fuse wings disposed on opposite sides of a second end of the fuse line, the first pairs of fuse wings sharing a first common fuse wing and the second pairs of fuse wings sharing a second common fuse wing; a bit line formed in the fourth interconnection layer, wherein the bit line is coupled to the first and second fuse lines and the first pairs of fuse wings; and wherein the first and second fuse lines are coupled to the first and second selection transistors through first and second lines, respectively, formed in the second interconnection layer. In an embodiment, the fuse wings of the first pairs of fuse wings and the fuse wings of the second pairs of fuse wings are spaced from the first and second fuse lines in the second interconnection layer by an insulator, wherein one fuse wing from the second pair of fuse wings of the first fuse element is coupled to the first line of the second interconnection layer, and wherein one fuse wing from the second pair of fuse wings of the second fuse element is coupled to the second line of the second interconnection layer.

Yet in another embodiment, a method of forming a programmed integrated circuit device includes forming an eFuse cell array including a plurality of pairs of adjacent pairs of eFuse cells, wherein each pair of eFuse cells includes: a first fuse line formed in a first metal layer; a second fuse line formed in the first metal layer; a first pair of fuse wings formed in the first metal layer on opposite sides of a first end of the first fuse line; a second pair of fuse wings formed in the first metal layer on opposites sides of a first end of the second fuse line; a third pair of fuse wings formed in the first metal layer on opposite sides of a second end of the first fuse line; and a fourth pair of fuse wings formed in the first metal layer on opposites sides of a second end of the second fuse line, wherein the first and second pairs of fuse wings share a first common fuse wing and the third and fourth pairs of fuse wings share a second common fuse wing; and programming one or more cells in the eFuse cell array. In certain embodiments, the programming step includes providing a programming current to damage the fuse line or lines of the one or more cells, respectively.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first fuse line formed in a first metal layer;
   a second fuse line formed in the first metal layer;
   a first pair of fuse wings formed in the first metal layer on opposite sides of a first end of the first fuse line;
   a second pair of fuse wings formed in the first metal layer on opposites sides of a first end of the second fuse line;
   a third pair of fuse wings formed in the first metal layer on opposite sides of a second end of the first fuse line; and
   a fourth pair of fuse wings formed in the first metal layer on opposites sides of a second end of the second fuse line, wherein the first and second pairs of fuse wings share a first common fuse wing and the third and fourth pairs of fuse wings share a second common fuse wing.

2. The integrated circuit structure of claim 1, further comprising:
   a first selection transistor coupled to the second end of the first fuse line and to a first word line;
   a second selection transistor coupled to the second end of the second fuse line and to a second word line; and
   a bit line coupled to the first ends of the first and second fuse lines.

3. The integrated circuit structure of claim 2, wherein the bit line is coupled to the first and second pairs of fuse wings.

4. The integrated circuit structure of claim 3, wherein the bit line is formed in a second metal layer above the first metal layer.

5. The integrated circuit structure of claim 4, wherein the first metal layer is a M2 metal interconnection layer of the integrated circuit structure and the second metal layer is a M3 metal interconnection layer of the integrated circuit structure.

6. The integrated circuit structure of claim 2, wherein the first selection transistor is coupled to the second end of the first fuse line through a first metal line formed in a second metal layer formed below the first metal layer and the second selection transistor is coupled to the second end of the first fuse line through a second metal line formed in the second metal layer.

7. The integrated circuit structure of claim 6, wherein the first and second word lines are formed in a third metal layer below the second metal layer.

8. The integrated circuit structure of claim 6, wherein the first metal line is coupled to a first one of the fuse wings in the third pair of fuse wings and the second metal line is coupled to a first one of the fuse wings in the fourth pair of fuse wings.

9. The integrated circuit structure of claim 8, wherein the second common fuse wing of the third and fourth pairs of fuse wings is floating.

10. The integrated circuit structure of claim 1, further comprising a fuse wall formed in the first metal layer, the fuse wall being disposed between a central portion of the first fuse line and a central portion of the second fuse line.

11. The integrated circuit structure of claim 10, further comprise a second fuse wall formed in the first metal layer and disposed adjacent to the central portion of the first fuse line and a third fuse wall formed in the first metal layer and disposed adjacent to the central portion of the second fuse line.

12. The integrated circuit structure of claim 1, wherein the fuse wings of the first, second, third and fourth pairs of fuse wings are spaced from the first and second fuse lines within the first metal layer by an insulator.

13. An integrated circuit structure comprising:
   an array of eFuse cells arranged in a plurality of rows and columns of eFuse cells, each eFuse cell comprising a respective selection transistor coupled to a respective word line and a respective fuse element formed in a metal layer, the fuse element being coupled to a respective bit line at a first end of the fuse element and to the selection transistor at a second end of the fuse element;
   the fuse element comprising a fuse line, a first pair of fuse wings formed on opposite sides of the first end of fuse line and a second pair of fuse wings formed on opposite sides of the second end of the fuse line; and
   wherein each fuse element shares a fuse wing from the first pair of fuse wings and a fuse wing from the second pair of fuse wings with the fuse element of one adjacent eFuse cell in the column of eFuse cells in which it is located.

14. The integrated circuit structure of claim 13, wherein the fuse wings of the first pair of fuse wings of each fuse element are coupled to the respective bit line to which the first end of the fuse element is coupled.

15. The integrated circuit structure of claim 14, wherein one of the fuse wings of the second pair of fuse wings of each fuse element is coupled to the selection transistor and the other one of the fused wings of the second pair of fuse wings is floating.

16. The integrated circuit structure of claim 15, wherein the floating fuse wing is the fuse wing shared with the fuse element of the one adjacent eFuse cell.

17. The integrated circuit structure of claim 13, further comprising a pair of fuse walls formed on opposite sides of a central portion of the fuse line of each fuse element.

18. The integrated circuit structure of claim 13, wherein the fuse wings of each fuse element are spaced from the fuse line within the metal layer by an insulator.

19. A method of forming a programmed integrated circuit device comprising:
forming an eFuse cell array comprising a plurality of pairs of adjacent pairs of eFuse cells, each pair of eFuse cells comprising:
a first fuse line formed in a first metal layer;
a second fuse line formed in the first metal layer;
a first pair of fuse wings formed in the first metal layer on opposite sides of a first end of the first fuse line;
a second pair of fuse wings formed in the first metal layer on opposites sides of a first end of the second fuse line;
a third pair of fuse wings formed in the first metal layer on opposite sides of a second end of the first fuse line; and
a fourth pair of fuse wings formed in the first metal layer on opposites sides of a second end of the second fuse line, wherein the first and second pairs of fuse wings share a first common fuse wing and the third and fourth pairs of fuse wings share a second common fuse wing; and
programming one or more cells in the eFuse cell array.

20. The method of claim 19, wherein the programming step comprises providing a programming current to damage the fuse line or lines of the one or more cells, respectively.

* * * * *